United States Patent
Ozeki et al.

(10) Patent No.: US 11,024,771 B2
(45) Date of Patent: Jun. 1, 2021

(54) METHOD FOR MANUFACTURING LIGHT EMITTING DEVICE

(71) Applicant: NICHIA CORPORATION, Anan (JP)

(72) Inventors: Kenji Ozeki, Tokushima (JP); Akira Goto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/803,589

(22) Filed: Feb. 27, 2020

(65) Prior Publication Data

US 2020/0194627 A1   Jun. 18, 2020

Related U.S. Application Data

(63) Continuation of application No. 16/268,158, filed on Feb. 5, 2019, now Pat. No. 10,615,310, which is a (Continued)

(30) Foreign Application Priority Data

Dec. 28, 2016 (JP) .............................. JP2016-254851

(51) Int. Cl.
*H01L 33/38* (2010.01)
*H01L 33/48* (2010.01)
(Continued)

(52) U.S. Cl.
CPC .............. *H01L 33/38* (2013.01); *H01L 24/11* (2013.01); *H01L 24/14* (2013.01); *H01L 24/17* (2013.01);
(Continued)

(58) Field of Classification Search
CPC ....... H01L 33/387; H01L 33/36; H01L 33/38; H01L 33/382; H01L 33/486; H01L 33/50;
(Continued)

(56) References Cited

U.S. PATENT DOCUMENTS 6,455,878 B1 *   9/2002   Bhat ...................... H01L 24/17
                                                                257/99
7,754,507 B2 *   7/2010   Epler ..................... H01L 24/97
                                                                438/26
(Continued)

FOREIGN PATENT DOCUMENTS

JP   2006-074007 A   3/2006
JP   2008-108952 A   5/2008
(Continued)

OTHER PUBLICATIONS

Notice of Allowance of the U.S. Appl. No. 16/268,158, dated Dec. 3, 2019.
(Continued)

*Primary Examiner* — Eduardo A Rodela
(74) *Attorney, Agent, or Firm* — Global IP Counselors, LLP

(57) ABSTRACT

A method for manufacturing a light emitting device includes: providing a substrate defining a mounting region having a wiring pattern on an upper face thereof; forming a plurality of bumps arranged in a plurality of columns extending parallel to each other with a distance between adjacent ones of the bumps in one of the columns arranged closest to an outer edge of the mounting region is larger than a distance between adjacent ones of the bumps arranged on an inner side in a plan view, and the bumps include first bumps and second bumps with the first bumps including first large bumps and first small bumps, with all the bumps in the one of the columns arranged closest to the outer edge are the same size; mounting the light emitting element onto the bumps in a flip-chip manner; and forming a cover member.

16 Claims, 12 Drawing Sheets

Related U.S. Application Data continuation of application No. 15/841,769, filed on Dec. 14, 2017, now Pat. No. 10,243,106.

(51) Int. Cl.
  *H01L 33/50* (2010.01)
  *H01L 23/00* (2006.01)
  *H01L 33/00* (2010.01)
  *H01L 33/60* (2010.01)
  *H01L 33/36* (2010.01)
  *H01L 33/52* (2010.01)
  *H01L 33/62* (2010.01)

(52) U.S. Cl.
  CPC ............ *H01L 33/005* (2013.01); *H01L 33/36* (2013.01); *H01L 33/382* (2013.01); *H01L 33/387* (2013.01); *H01L 33/486* (2013.01); *H01L 33/50* (2013.01); *H01L 33/52* (2013.01); *H01L 33/60* (2013.01); *H01L 33/62* (2013.01); *H01L 2224/1403* (2013.01); *H01L 2224/1415* (2013.01)

(58) Field of Classification Search
  CPC ....... H01L 24/14; H01L 33/005; H01L 33/60; H01L 2224/1415; H01L 33/62; H01L 2224/1403; H01L 33/48; H01L 2933/0066; H01L 2933/0033; H01L 33/52; H01L 33/54; H01L 33/56; H01L 24/03; H01L 24/06; H01L 24/09; H01L 24/11; H01L 24/17; H01L 23/48; H01L 23/49838; H01L 23/528; H01L 23/488
  See application file for complete search history.

(56) References Cited

U.S. PATENT DOCUMENTS

| | | | |
|---|---|---|---|
| 8,384,118 B2* | 2/2013 | Schiaffino | H01L 33/382 257/99 |
| 9,653,665 B2 | 5/2017 | Lopez et al. | |
| 9,824,952 B2 | 11/2017 | Choi et al. | |
| 2001/0045635 A1 | 11/2001 | Kinzer et al. | |
| 2004/0012958 A1 | 1/2004 | Hashimoto et al. | |
| 2004/0017008 A1* | 1/2004 | Ueda | H01L 22/32 257/734 |
| 2004/0080043 A1* | 4/2004 | Tsai | H01L 23/49816 257/723 |
| 2004/0124007 A1 | 7/2004 | Ashida | |
| 2004/0232548 A1 | 11/2004 | Maruko | |
| 2006/0261358 A1* | 11/2006 | Hwang | H01L 24/03 257/91 |
| 2007/0145379 A1 | 6/2007 | Eliashevich et al. | |
| 2009/0039376 A1 | 2/2009 | Uemoto et al. | |
| 2009/0045510 A1 | 2/2009 | Naya | |
| 2009/0127702 A1 | 5/2009 | Dekker et al. | |
| 2010/0252855 A1 | 10/2010 | Kamei | |
| 2013/0087763 A1 | 4/2013 | Kim et al. | |
| 2015/0097286 A1* | 4/2015 | Suen | H01L 22/12 257/737 |
| 2015/0098224 A1 | 4/2015 | Hong et al. | |
| 2015/0280071 A1 | 10/2015 | Takenaga et al. | |
| 2018/0331043 A1 | 11/2018 | Zhang et al. | |

FOREIGN PATENT DOCUMENTS

| | | |
|---|---|---|
| JP | 2009-049499 A | 3/2009 |
| JP | 2011-210789 A | 10/2011 |
| JP | 2014-045027 A | 3/2014 |
| JP | 2014-207267 A | 10/2014 |
| JP | 2015-192099 A | 11/2015 |
| WO | 2009063638 A1 | 5/2009 |

OTHER PUBLICATIONS

Non Final Office Action of the U.S. Appl. No. 15/841,769, dated Jul. 10, 2018.
Notice of Allowance of the U.S. Appl. No. 15/841,769, dated Nov. 7, 2018.
Non Final Office Action of the U.S. Appl. No. 16/268,158, dated Jul. 11, 2019.
Non Final Office Action of the U.S. Appl. No. 16/268,158, dated Dec. 3, 2019.

* cited by examiner

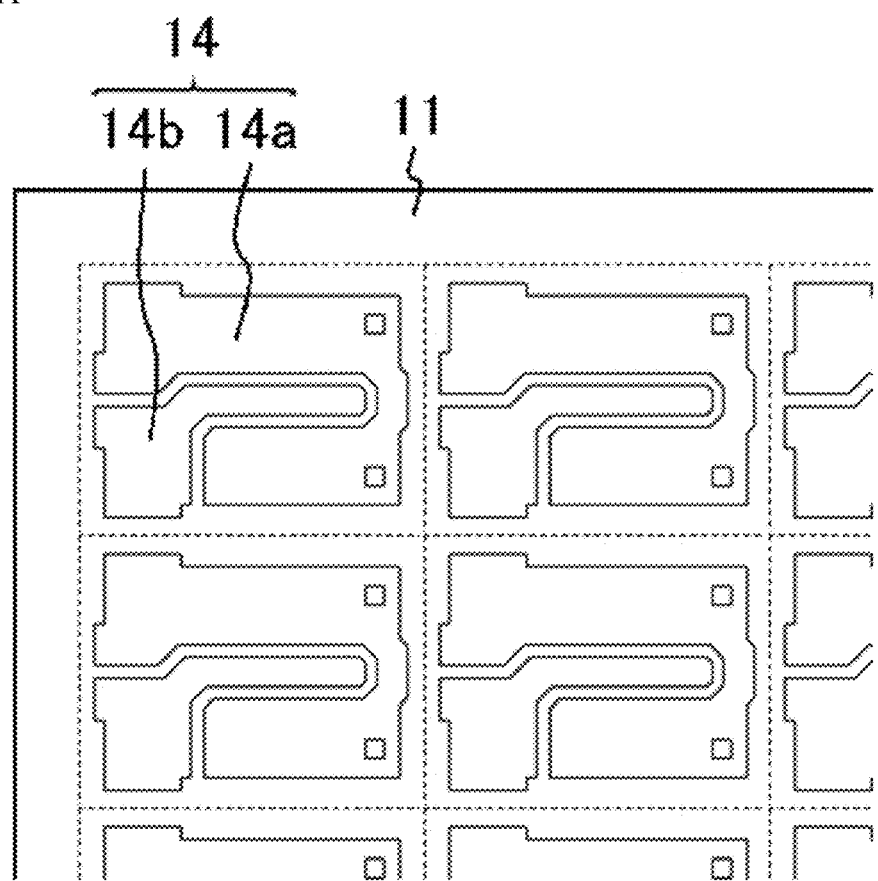

METHOD FOR MANUFACTURING LIGHT EMITTING DEVICE

CROSS-REFERENCE TO RELATED APPLICATIONS

This is a continuation application of U.S. patent application Ser. No. 16/268,158 filed on Feb. 5, 2019, which is a continuation application of U.S. patent application Ser. No. 15/841,769 filed on Dec. 14, 2017, now U.S. Pat. No. 10,243,106. The present application claims priority to Japanese Patent Application No. 2016-254851, filed on Dec. 28, 2016. The entire disclosures of U.S. patent application Ser. Nos. 16/268,158 and 15/841,769, and Japanese Patent Application No. 2016-254851 are hereby incorporated herein by reference.

BACKGROUND

The present invention relates to a method for manufacturing a light emitting device.

Improvements in the crystal quality of light emitting diodes made it possible to increase the output and the luminance. As a consequence, they are utilized in various areas, such as general illumination and automotive lighting applications, and further quality improvements have been proposed.

For example, there is known a light emitting element having a structure in which the n-type electrode connected to the n-type semiconductor layer, which is exposed from the p-type semiconductor layer and the emission layer, is disposed on the p-type semiconductor layer via an insulation film in order to achieve high luminance and good luminance distribution. See, for example, Japanese Unexamined Patent Application Publication Nos. 2015-192099 and 2014-207267.

SUMMARY

One object of an embodiment of the present invention is to provide a light emitting device capable of achieving good luminance distribution and a method for manufacturing the same.

A method for manufacturing a light emitting device includes: providing a substrate defining a mounting region having a wiring pattern on an upper face thereof; forming a plurality of bumps for bonding a light emitting element to the wiring pattern in the mounting region of the substrate so that the bumps are arranged in a plurality of columns extending parallel to each other with a distance between adjacent ones of the bumps in one of the columns arranged closest to an outer edge of the mounting region is larger than a distance between adjacent ones of the bumps arranged on an inner side of the mounting region in a plan view, and so that the bumps include a plurality of first bumps and a plurality of second bumps with the first bumps including a plurality of first large bumps and a plurality of first small bumps each having a smaller surface area than each of the first large bumps in a plan view, with all the bumps in the one of the columns arranged closest to the outer edge of the mounting region are the same size; mounting the light emitting element onto the bumps in the mounting region of the substrate in a flip-chip manner so that the first bumps are bonded to a first electrode of the light emitting element and the second bumps are bonded to a second electrode of the light emitting element; and forming a cover member that covers lateral faces of the light emitting element and the bumps.

According to the present invention, a light emitting element capable of achieving good luminance distribution can be provided.

BRIEF DESCRIPTION OF THE DRAWINGS

FIG. 4A is a schematic enlarged plan view for explaining a substrate preparation step in the method for manufacturing a light emitting device according to the present invention.

DETAILED DESCRIPTION OF THE EMBODIMENTS

Figure 1A:
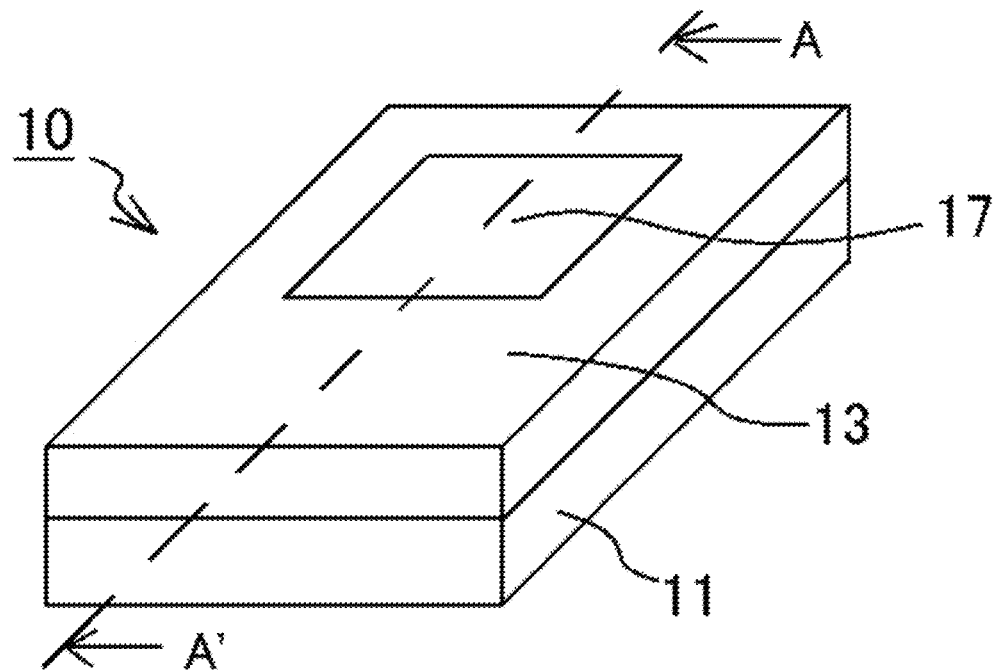
FIG. 1A is a schematic perspective view of one embodiment of the light emitting device according to the present invention.

One embodiment for practicing the present invention will be explained below with reference to the accompanying drawings. The embodiment described below, however, is an illustration for the purpose of embodying the technical concept of the present invention, and does not limit the present invention. The sizes of the members and their positional relationship shown in each drawing might be exaggerated for clarity of the explanations. Furthermore, the same designations and reference numerals represent members that are identical or similar in nature as a rule, and redundant explanations are omitted when appropriate.

Light Emitting Device

Figure 1B:
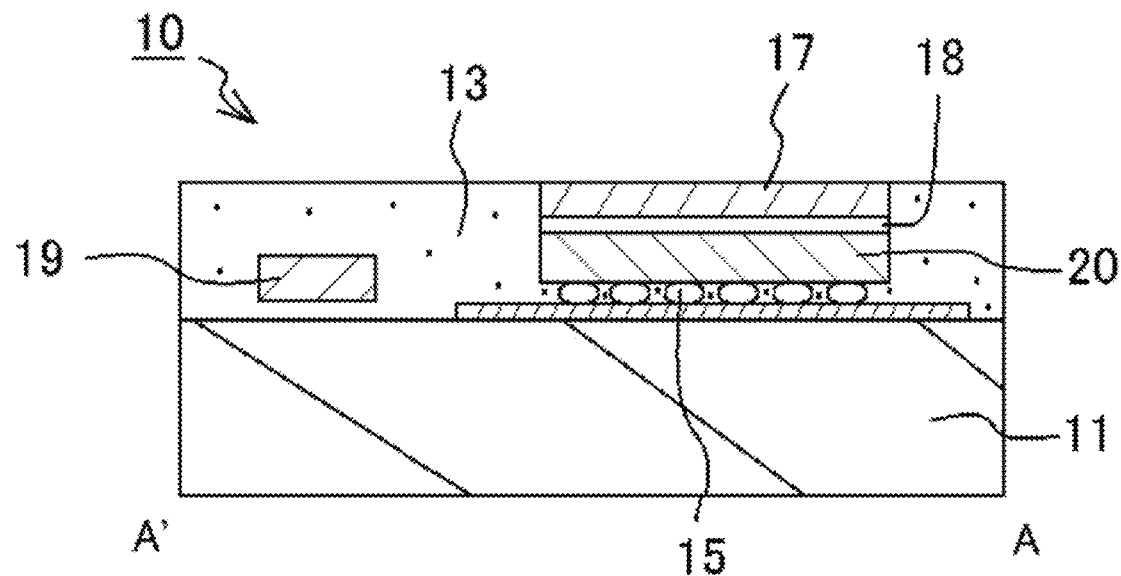
FIG. 1B is a cross sectional view taken along line A-A' in FIG. 1A.

The light emitting device 10 related to the present embodiment, as shown in FIGS. 1A and 1B, includes a substrate 11, a light emitting element 20, and a cover member 13.

Figure 4B:
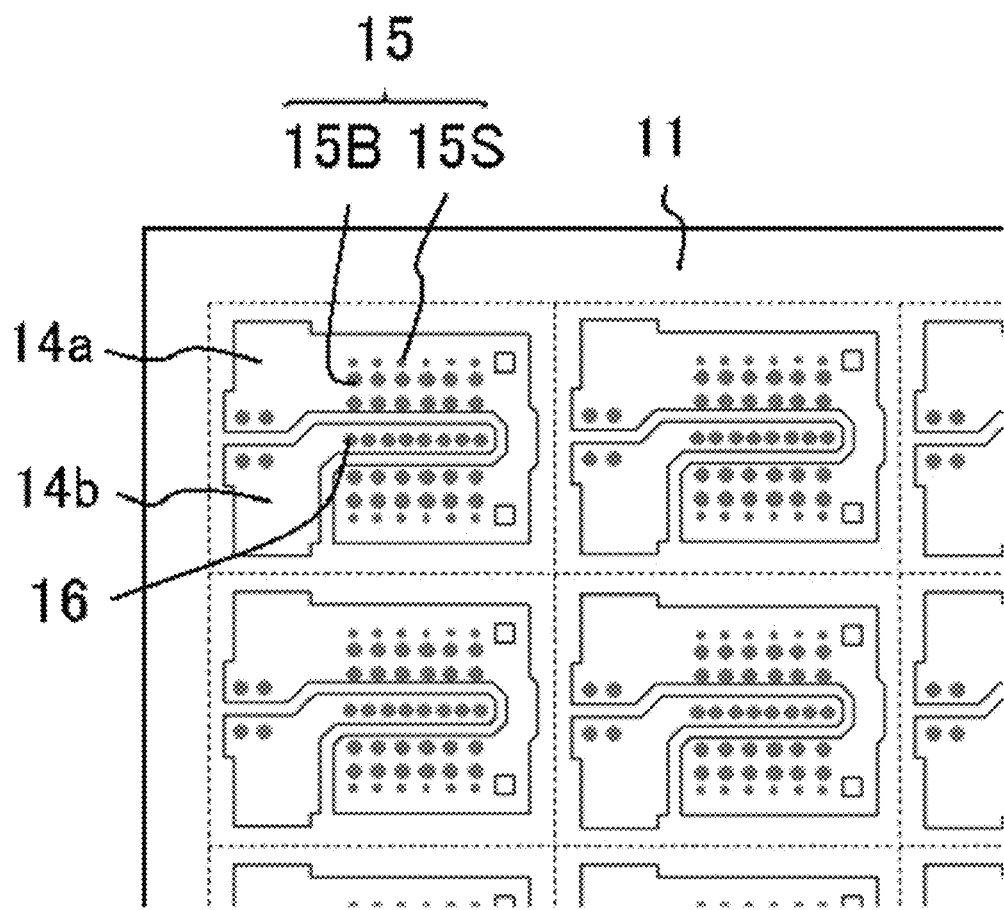
FIG. 4B is a schematic enlarged plan view for explaining a bump forming step in the method for manufacturing a light emitting device according to the present invention.

The substrate 11, as shown in FIGS. 1B, 4A, and 4B, defines a plurality of mounting regions (the boundary of the mounting regions is shown in dotted lines in FIG. 4A) each having a wiring pattern 14 on its upper face. On the wiring pattern 14, first bumps 15 and second bumps 16 are arranged, and the light emitting element 20 is flip-chip mounted via the first bumps 15 and the second bumps 16. Moreover, on the substrate 11, the cover member 13 that covers the light emitting element 20, the first bumps 15, and the second bumps 16 is disposed.

Figure 2A:
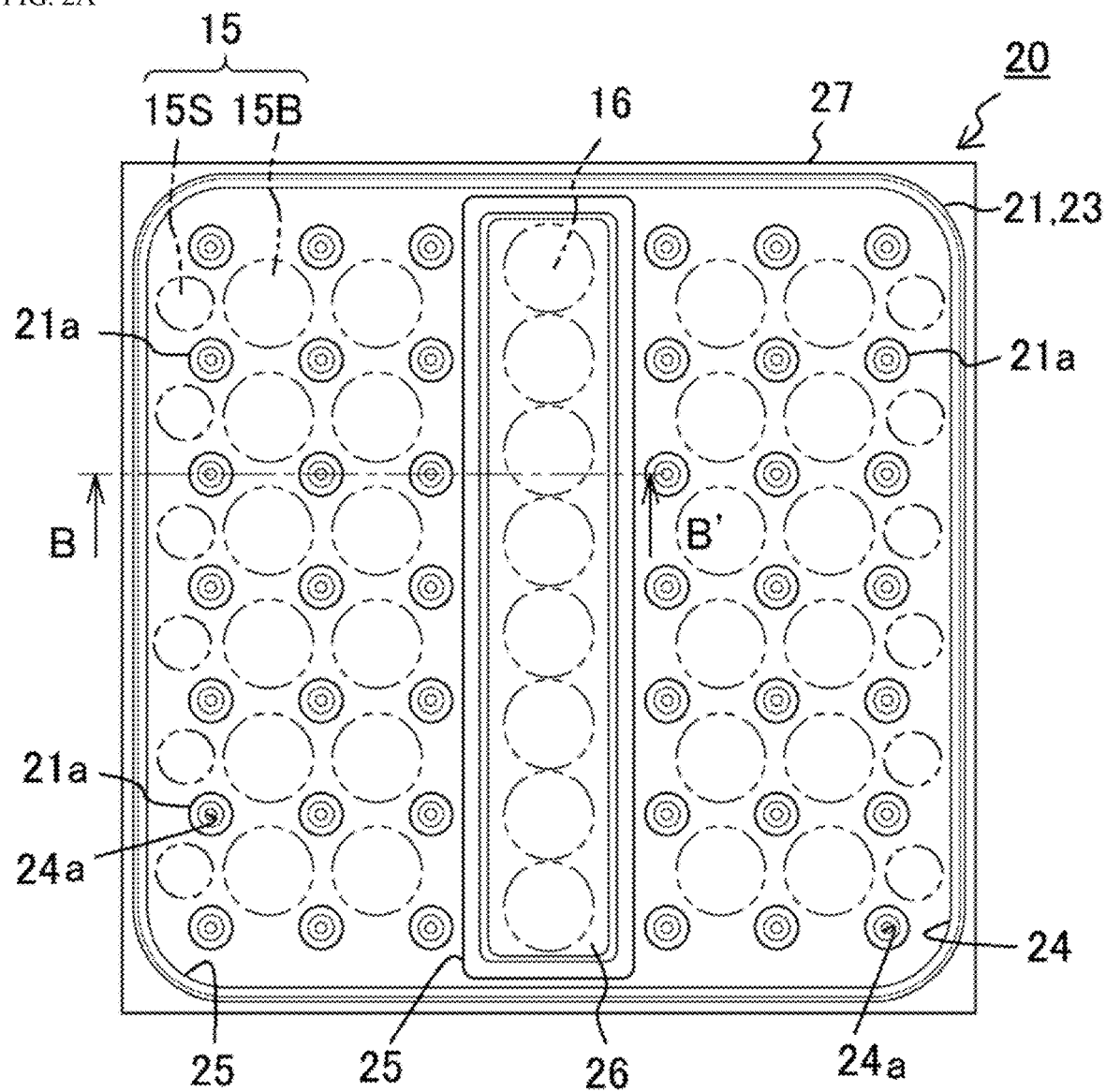
FIG. 2A is a schematic plan view of the light emitting element used in the light emitting device in FIG. 1A.
Figure 2B:
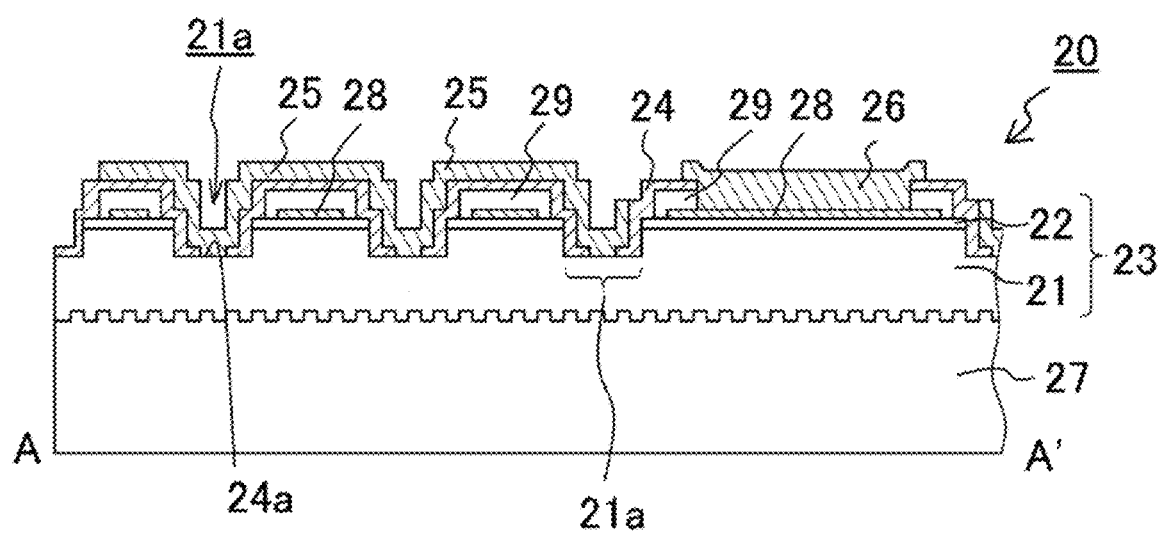
FIG. 2B is a partial cross sectional view taken along line B-B' in FIG. 2A.

The light emitting element 20, as shown in FIG. 2B, includes a semiconductor stack 23 which successively has a first semiconductor layer 21, an emission layer, and a second semiconductor layer 22 as well as having a plurality of exposed portions 21a exposing the first semiconductor layer 21 from the second semiconductor layer 22 on the upper face side of the second semiconductor layer 22; an insulation film 24 which covers the semiconductor stack 23 and has openings 24a above the plurality of exposed portions 21a; a first electrode 25 connected to the exposed portions 21a at the bottom face of the openings 24a and partially disposed on the second semiconductor layer 22 via the insulation film 24; and a second electrode 26 connected onto the second semiconductor layer 22.

The bumps include the first bumps 15 bonded to the first electrode 25, and the second bumps 16 bonded to the second electrode 26. In a plan view, the first bumps 15 are spaced apart from the exposed portions 21a, and include two types having different surface areas.

The light emitting element 20 includes a plurality of exposed portions where the first semiconductor layer is exposed from the second semiconductor layer on the upper face side of the second semiconductor layer in the semiconductor stack 23. If the exposed portions and the first bumps are arranged to overlap one another, i.e., if the first bumps are disposed directly above the exposed portions 21a, the impact of flip chip mounting might cause a crack to form in the insulation film. It is preferable to position the first bumps apart from the exposed portions in a plan view so that the cracks are not allowed to form in the insulation film. In the light emitting device 10, the first bumps 15 include large and small bumps, having different surface areas. Thus, a large number of first bumps can be densely arranged on the first electrode while avoiding the positions immediately above the exposed portions. This reduces the chances of localizing the current density to be supplied to the light emitting element, thereby reducing illuminance variance.

Furthermore, the high-density arrangement of the bumps directly under the light emitting element can increase the paths for dissipating the heat generated by the light emitting element during emission through the substrate via the bumps. The high-density arrangement facilitates the flow of the uncured resin material used for forming the cover member between the light emitting element and the substrate when the cover member covering the lateral faces of the light emitting elements and the bumps is formed on the substrate, reducing the chances of void formation or the like directly under the light emitting element. This can prevent light from leaking from the lower face of the light emitting element, as well as effectively preventing the light emitting element from separating from the substrate which would otherwise be caused by the expansion of a void as the temperature surrounding the light emitting device changes. Thus, a higher quality light emitting device can be provided.

Substrate 11

The substrate 11 has a wiring pattern 14 on the upper face thereof, and the light emitting element 20 is flip-chip mounted on the wiring pattern 14 via bumps 15 and 16. Examples of the substrate materials include insulating materials, such as a glass fiber reinforced epoxy, resins, and ceramics, as well as a metal material with an insulating material formed on the surface thereof. Among all, a ceramic material which is highly heat resistant and weather resistant is preferable for the substrate. Ceramics materials include alumina, aluminum nitride, and the like.

The substrate 11 has multiple wiring patterns 14 on the upper surface thereof.

Such a wiring pattern 14 may be anything that can supply electric current to the light emitting element, and can be formed using any material, thickness, or shape ordinarily employed in the art. Specifically, the wiring pattern 14 can be formed, for example, using a metal, such as copper, aluminum, gold, silver, platinum, titanium, tungsten, palladium, iron, nickel, or the like, or an alloy containing these. Particularly, the outermost surface of the wiring pattern formed on the upper face of the substrate is preferably covered with a highly reflective material, such as silver or gold, in order to efficiently extract light from the light emitting element 20. The wiring pattern can be formed by electroplating, electroless plating, vapor deposition, sputtering, or the like. In the case of using Au bumps for mounting the light emitting element on the substrate, for example, using Au as the outermost surface of the wiring pattern can improve the bonding between the substrate and the substrate.

The wiring pattern 14 preferably has a pair of positive and negative patterns on the upper face of the substrate 11. Such wiring pattern allows for the connection of the first electrode of the first semiconductor layer and the second electrode of the second semiconductor layer in the light emitting element by way of flip chip mounting. The wiring pattern 14 may be disposed not only on the upper surface of the substrate 11, but also inside and/or on the lower surface thereof Bumps 15 and 16

The wiring pattern 14 has, on the upper surface, first bumps 15 to be connected to the first electrode, and second bumps 16 to be connected to the second electrode, of the light emitting element used for flip chip mounting of the light emitting element described later. Multiple bumps are disposed for each. In the present embodiment, the first bumps 15, as shown in FIG. 4B, include two types having different surface areas. Examples of the plan view shapes of the bumps include a circular shape, substantially circular shape, or the like. The two types of first bumps having different surface areas include first large bumps 15B, and first small bumps 15S each having a smaller surface area than a first large bump 15B. The second bumps 16 may have a different size from the first bumps 15, but preferably have a similar size to that of the first large bumps 15B. The surface areas of the two types of first bumps 15 are appropriately set in accordance with the size or the like of the light emitting element used. From the standpoint of heat dissipation and bonding strength, the larger the total bump surface area bonded to a single light emitting element, the more preferable it is. Considering the layout of the exposed portions, however, the length of the longest line segment (e.g., the diameter in the case of a circular shape) of each first large bump 15B is preferably smaller than the distance between the centers of two adjacent exposed portions. It is preferable for the first small bumps 15S to each have about 30 to 70% of the surface area of each first large bump. This allows the first small bumps to be disposed in the regions where the first large bumps cannot be disposed, thereby increasing the total bump surface area.

By providing the first bumps having two different surface areas in this manner, the bumps can be densely arranged on the surface of the light emitting element without overlapping the exposed portions arranged on the semiconductor stack. This can distribute the current density supplied to the light emitting element, thereby attenuating luminance variance.

In the case where the light emitting element 20 has a rectangular plan view shape, in particular, it is preferable to arrange the first small bumps 15S at least in the vicinity of two opposing sides of the rectangular shape, along the sides. They may be arranged in the vicinity of each side of the two pairs of opposing sides, along each side. Such a layout enables uniform injection of electric current even in the vicinity of the perimeter of the light emitting element, thereby achieving an even more uniform luminance distribution and ensuring uniform in-plane heat dissipation.

The two types of first bumps having different surface areas may have about the same height, or have different heights. For example, the first large bumps 15B preferably have a larger height than the first small bumps. Since the first small bumps 15S are arranged in narrow regions in the regions where the first large bumps 15B cannot be disposed, giving them a lower height than the first large bumps 15B can reduce the impact resulting from bonding as compared to that applied to the first large bumps 15B, thereby more effectively preventing the bumps from being crushed and expanding their surface areas.

Although the first large bumps 15B and the first small bumps 15S may be regularly or randomly arranged, they are preferably regularly arranged so that the current density supplied to the light emitting element 20 would not be localized.

The first bumps 15 and the second bumps 16 can be formed with, for example, gold, silver, copper, tin, platinum, zinc, nickel, or their alloys, and can be formed by using, for example, stud bumps known in the art. Stud bumps can be formed using a stud bump bonder, wire bonding apparatus, or the like.

Light Emitting Element 20

The light emitting element 20, as shown in FIG. 2B, has a semiconductor stack 23 in which a first semiconductor layer 21, an emission layer, and a second semiconductor layer 22 are stacked in that order, an insulation film 24, a first electrode 25, and a second electrode 26. The semiconductor stack 23 has, on the upper face side of the second semiconductor layer 22, a plurality of exposed portions 21a exposing the first semiconductor layer 21 from the second semiconductor layer 22 on the upper face side of the second semiconductor layer 22. The insulation film 24 covers the semiconductor stack 23, and has openings 24a above the plurality of exposed portions 21a. The first electrode 25 is connected to the exposed portions 21a at the openings 24a, and is partly disposed on the second semiconductor layer 22 via the insulation film 24. The second electrode 26 is electrically connected to the second semiconductor layer 22, and is disposed on the second semiconductor layer 22.

Examples of the plan view shapes of the light emitting element and/or the semiconductor stack include polygons, such as a rectangle or hexagon, a polygon with rounded corners, circle, ellipse, or the like.

Semiconductor Stack 23

The semiconductor stack 23 is formed by successively stacking a first semiconductor layer 21 (e.g., n-type semiconductor layer), an emission layer, and a second semiconductor layer 22 (e.g., p-type semiconductor layer) on a growth substrate 27. In the state of being incorporated in a light emitting element 20, however, the semiconductor stack can be one from which the growth substrate 27 has been removed.

Examples of the first semiconductor layer, the emission layer, and the second semiconductor layer include various semiconductors, such as group III-V compound semiconductors, group II-VI compound semiconductors, and the like. Specific examples include nitride-based semiconductor materials such as $In_XAl_YGa_{1-X-Y}N$ ($0 \leq X$, $0 \leq Y$, $X+Y \leq 1$); InN, AlN, GaN, InGaN, AlGaN, InGaAlN, or the like can be used. Any film thickness or layer structure known in the art can be used for each layer.

Growth Substrate 27

For the growth substrate 27, any that allows for epitaxial growth of the semiconductor layers can be used. Examples of such growth substrate materials include insulating substrates, such as sapphire ($Al_2O_3$), spinel ($MgAl_2O_4$), or the like.

Exposed Portions 21a

The semiconductor stack 23 has multiple exposed portions 21a where the second semiconductor layer 22 and the emission layer are removed across their entire thicknesses, exposing the first semiconductor layer 21 from the second semiconductor layer and the emission layer. In other words, the semiconductor stack 23 has holes on the surface on the second semiconductor layer side, and the first semiconductor layer 21 is exposed at the bottom faces of the holes. The second semiconductor layer 22, the emission layer, and the first semiconductor layer 21 are exposed at the lateral faces of the holes.

Although the shape, the size, the positions, and the number of the exposed portions can be appropriately set in accordance with the intended size, shape, electrode pattern, or the like of the light emitting element, multiple exposed portions are preferably formed on the inner side of the edges of the semiconductor stack. The exposed portions are preferably disposed in a regular sequence. This can attenuate illuminance variance of the light emitting element thereby allowing light to be uniformly extracted.

The exposed portions 21a are electrically connected to the first electrode described later. The first electrode connected to the exposed portions is formed on the second semiconductor layer via the insulation film 24 discussed later. Such exposed portions are preferably arranged so as to be spaced apart from one another in a plan view, more preferably arranged in a regular sequence while maintaining a certain distance from one another. The exposed portions may all have the same shape and size, may individually or some of them may have different shapes and sizes. However, the exposed portions preferably have about the same size and shape. Since the exposed portions are the regions having no emission layer, regularly arranging multiple exposed regions of about the same size can attenuate localization of the emission area or the amount of the electrical current supplied. As a result, luminance variance of the light emitting element can be attenuated as a whole.

Examples of the shapes of the exposed portions include a circle, ellipse, or polygon, such as a triangular, rectangular, or hexagonal shape, or the like. Among all, a circular shape, or substantially circular shape (e.g., ellipse or polygon with at least six sides) is preferable. The size of the exposed portions can be appropriately adjusted based on the size of the semiconductor stack and the output, luminance, or the like of the light emitting element desired. The size of about several ten to several hundred μm in diameter, for example, is preferable. From another perspective, the diameter is preferably about ⅟₂₀ to ⅕ of a side of the semiconductor stack.

The total area of the exposed portions arranged on the inner side of the edges of the semiconductor stack is preferably 30% at most, 25% at most, 18% at most, or 15% at most of the surface area of the semiconductor stack. Setting the total area in these ranges can attain balance in the electric current supplied to the light emitting element, thereby attenuating illuminance variance attributable to localization of the power supplied.

Insulation Film 24

The insulation film 24 covers the upper face and the lateral faces of the semiconductor stack 23, and has openings 24a above the exposed portions 21a. Because the insulation film 24 covers the semiconductor stack 23 and have the openings 24a above the exposed portions 21a, the first electrode 25 can be formed over a more extensive area of the upper face of the insulation film 24.

The insulation film 24 is formed using a material and thickness capable of securing electrical insulation known in the art. Specifically, a metal oxide or metal nitride can be used for the insulation film 24; for example, at least an oxide or nitride selected from the group consisting of Si, Ti, Zr, Nb, Ta, and Al can suitably be used.

First Electrode 25 and Second Electrode 26

The first electrode 25 and the second electrode 26 are disposed on the upper face side of the semiconductor stack (i.e., on the second semiconductor layer side opposite the growth substrate). The first electrode and the second electrode may be electrically connected to the first semiconductor layer and the second semiconductor layer, respectively, via the reflective electrode described later, instead of being directly connected thereto.

The first electrode and the second electrode can be formed using metals such as Au, Pt, Pd, Rh, Ni, W, Mo, Cr, Ti, Al, Cu, or their alloys as a single layer film or multilayered film. Specifically, these electrodes can be formed with a multilayered film, such as Ti/Rh/Au, Ti/Pt/Au, W/Pt/Au, Rh/Pt/Au, Ni/Pt/Au, Al—Cu alloy/Ti/Pt/Au, Al—Si—Cu ally/Ti/Pt/Au, Ti/Rh, or the like, stacked from the semiconductor layer side. Any film thickness used in the art can be employed.

The shapes of the first electrode and the second electrode, in the case of a rectangular semiconductor stack, are preferably similarly rectangular or substantially rectangular. The first electrode and the second electrode are preferably arranged in parallel and alternately in one direction in a single semiconductor stack in a plan view. For example, it is preferable to arrange them so that the first electrode interposes the second electrode in a plan view.

The first electrode is electrically connected to the exposed portions arranged on the second semiconductor layer side of the semiconductor stack described above. In this case, the first electrode is preferably connected so as to cover the exposed portions, more preferably connected to all exposed portions integrally. Accordingly, the first electrode is disposed not only on the first semiconductor, but also above the second semiconductor layer. In this case, the first electrode 25 is disposed on the lateral faces (i.e., the lateral faces of the emission layer and the second semiconductor layer) of the holes that form the exposed portions and the second semiconductor layer via the insulation film 24.

The second electrode is disposed on the second semiconductor layer of the semiconductor stack described above, and is electrically connected to the second semiconductor layer. The second electrode may be in direct contact with the second semiconductor layer, but is preferably disposed on the second semiconductor layer via the reflective electrode discussed later.

Reflective Electrode

As shown in FIG. 2B, the light emitting element 20 has a reflective electrode 28 interposed between the second electrode and the second semiconductor layer.

For the reflective electrode 28, silver, aluminum, or an alloy having either of these as a major component can be used, and silver or a silver alloy having high reflectance for the light emitted from the emission layer, in particular, is more preferable. The reflective electrode 28 preferably has a thickness that can effectively reflect the light emitted from the emission layer, for example, about 20 nm to 1 µm. The larger the contact area between the reflective electrode and the second semiconductor layer, the more preferable it is. Accordingly, it is preferable to dispose the reflective electrode 28 also between the first electrode 25 and the second semiconductor layer 22. Specific examples of the total surface area of the reflective electrode 28 include at least 50%, at least 60%, or at least 70% of the surface area of the semiconductor stack.

In the case where the reflective electrode 28 contains silver, a protective layer 29 that covers the upper face thereof, more preferably the upper face and the lateral faces thereof, may be provided in order to prevent the migration of silver.

The protective layer 29 may be formed using a conductive material, such as a metal, alloy, or the like, usually used as an electrode material, or may be formed using an insulating material. Examples of conductive materials include a single layer or multilayered film containing a metal, such as aluminum, copper, nickel, or the like. Examples of insulating materials include those mentioned earlier with reference to the insulation film 24, and SiN, among all, is preferably used. An SiN is a dense film and thus excels in preventing moisture penetration. The thickness of the protective layer 29 is, for example, about several hundred nm to several µm for effectively preventing silver migration.

In the case of forming the protective layer 29 with an insulating material, providing an opening in the protective layer 29 above the reflective electrode can achieve electrical connection between the reflective electrode and the second electrode.

In the case where the light emitting element 20 has the reflective electrode 28 and the protective layer 29 on the second semiconductor layer, the insulating film 24 that covers the semiconductor stack 23 covers the reflective electrode 28 and the protective layer 29, and has an opening directly under the second electrode 26 whereby the second electrode 26 and the reflective electrode 28 are electrically connected.

Cover Member 13

The cover member 13, as shown in FIG. 1B, covers the light emitting element 20, the first bumps 15, the second bumps 16, and part of or the entire upper face of the substrate 11. Above all, the cover member 13 preferably entirely covers the lateral faces of the light emitting element 20, between the light emitting element 29 and the substrate 11, the upper face of the substrate 11, and the lateral faces of the first bumps 15 and the second bumps 16.

The cover member 13 can be formed with a resin having light reflecting, transmitting, or light shielding properties, or any such resin containing a light reflecting substance, phosphor, diffusing agent, coloring agent, or the like. Among all, the cover member preferably has light reflecting and/or light shielding properties. Any resin, light reflecting substance, and the like ordinarily used in the art can be used to structure the cover member.

Examples of resins include a resin containing one or more, or a hybrid resin, of silicone resins, modified silicone resins, epoxy resins, modified epoxy resins, and acrylic resins. Examples of light reflecting substances include titanium oxide, silicon oxide, zirconium oxide, potassium titanate, alumina, aluminum nitride, boron nitride, mullite, and the like.

The material that structures the cover member 13 preferably includes a resin having high fluidity and is curable by heat or irradiation of light from the standpoint of ease of penetration between the light emitting element and the substrate, as well as void prevention. Such a material, for example, has fluidity indicated by the viscosity of 0.5 to 30 Pa·s. Moreover, the amount of reflection and the amount of transmittance can be varied by the content of the light reflecting substance or the like in the material that structures the cover member 13. For example, the cover member preferably contains at least 20 wt % of a light reflecting substance.

The cover member 13 can be formed by, for example, injection molding, potting, resin printing, transfer molding, compression molding, or the like.

Light Transmissive Member 17

As shown in FIG. 1A and FIG. 1B, the light emitting device 10 has a light transmissive member 17 on the light emitting element 20. The light emitting element 20 is flip-chip mounted on the wiring pattern using the face having the first and second electrodes as the lower face. The light emitting element 20 uses the opposing upper face as the principal light extraction face which is bonded to the lower face of the light transmissive member 17.

The light transmissive member 17 covers the light extraction face of the light emitting element and is capable of transmitting at least 50% or at least 60%, preferably at least 70% of the light emitted by the light emitting element to be externally released. The light transmissive member can contain a light diffusing agent and/or a phosphor capable of converting the wavelength of at least part of the light emitted from the light emitting element 20.

The lower face of the light transmissive member preferably has an area which is about 80 to 150% of the upper face area of the light emitting element. The lower face perimeter of the light transmissive member preferably coincides with, or is positioned on the inside or the outside of, the upper face perimeter of the light emitting element. In other words, in a plan view, one of the light emitting element's upper face and the light transmissive member's lower face is preferably included in the other. The thickness of the light transmissive member, for example, is 50 to 300 μm.

The light transmissive member can be formed with, for example, a resin, glass, inorganic material, or the like. Examples of light transmissive members containing a phosphor include a phosphor sintered body as well as a resin, glass, or other inorganic material containing a phosphor. The light transmissive member may be a sheet-shaped molded resin, glass, inorganic material or the like, having a resin layer containing a phosphor formed on the surface thereof. The higher the transparency of the light transmissive member, the more reflection it achieves at the interface with the cover member, thereby increasing the luminance.

Examples of the phosphors to be contained in the light transmissive member include, in the case where a blue or ultraviolet light emitting element is used as the light emitting element 20, cerium-activated yttrium aluminum garnet-based phosphors (YAG:Ce); cerium-activated lutetium aluminum garnet-based phosphors (LAG:Ce); europium- and/or chromium-activated nitrogen-containing calcium aluminosilicate-based phosphors ($CaO$—$Al_2O_3$—$SiO_2$:Eu); europium-activated silicate-based phosphors (($Sr,Ba)_2SiO_4$: Eu); nitride-based phosphors, such as β-SiAlON phosphors (e.g., $Si_{6-Z}Al_ZO_ZN_{8-Z}$:Eu (0<Z<4.2)), CASN-based phosphors, SCASN-based phosphors or the like; KSF-based phosphors ($K_2SiF_6$:Mn); sulfide-base phosphors, and quantum dot phosphors. By combining these phosphors with a blue or ultraviolet light emitting element, light emitting devices of various emission colors (e.g., a white light emitting device) can be produced. In the case of including such a phosphor in the light transmissive member, the concentration of the phosphor is preferably, for example, about 5 to 50%.

The light transmissive member is bonded to cover the light extraction face of the light emitting element. The light transmissive member and the light emitting element can be bonded via a bonding material 18. For the bonding material 18, any known resin, such as epoxy or silicone, can be used. In bonding the light transmissive member to the light emitting element, moreover, a direct bonding method, such as crimping, sintering, surface activated bonding, atomic diffusion bonding, or hydroxide catalysis bonding, may alternatively be used.

In the case where the light emitting device 10 includes a light transmissive member 17, it is preferable to cover the lateral faces of the light transmissive member 17 in part or in whole with the cover member 13.

The light emitting device may optionally include other devices and electronic parts, such as a protective device 19 or the like. These devices and parts are preferably embedded in the cover member 13.

Method for Manufacturing a Light Emitting Device

The light emitting device according to the present embodiment primarily has a substrate preparation step, a bump forming step, a light emitting element mounting step, and a cover member forming step. The materials and layout of the members are as explained above with reference to the light emitting device 10, and thus the explanations here will be omitted when appropriate.

Furthermore, a step of disposing a light transmissive member 17 on the light emitting element 20 and a step of mounting electronic parts, such as a protective device, can optionally be included prior to forming the cover member 13.

Substrate Preparation Step

A substrate 11 having a wiring pattern 14 formed on the upper face thereof is prepared. As shown in FIGS. 4A and 4B, the substrate 11 simply needs to have on the surface thereof a wiring pattern 14, which include a first wiring pattern 14a to be connected to the first electrode of the light emitting element 20 and a second wiring pattern 14b to be connected to the second electrode of the light emitting element 20, formed as the wiring pattern 14.

In order to simultaneously manufacture multiple light emitting devices, a collective body of the substrates 11 is preferably used. Using the collective body of the substrates allows multiple light emitting devices to be collectively formed, thereby increasing the production efficiency. The collective body of the substrates can ultimately be divided into individual light emitting devices as shown in FIG. 4G.

Bump Forming Step

As shown in FIG. 4B, two types of first bumps 15 having different surface areas, i.e., first small bumps 15S each having a small surface area and first large bumps 15B each having a larger surface area than the first small bumps, are formed on the first wiring pattern 14a. Moreover, on the second wiring pattern 14b, second bumps 16 are formed. The second bumps 16 can each have a give surface area, but are preferably sized about the same as the first large bumps 15B or the first small bumps 15S for the purpose of increasing the production efficiency. It is preferable to suitably select the size of the second bumps by taking into consideration the plan view shape of the second electrode to be bonded so that the total surface area of the second bumps is large.

The layouts of the bumps relative to the wiring pattern are determined in accordance with the exposed portions, the electrode layout, or the like of the light emitting element to be mounted thereon while enabling the mounting of the light emitting element discussed later.

The first bumps and the second bumps can be formed by using, for example, a commercially available stud bump bonder or wire bonder. Specifically, the tip of the metal wire fed through the capillary of a stud bump bonder is melted to form a ball and the formed ball is bonded to a wiring pattern 14, followed by separating the bonded ball from the metal wire. Stud bumps are formed on the wiring pattern in this manner. It is preferable to separate a ball from the metal wire so that the upper end thereof is relatively flat by lifting the capillary while holding the metal wire after bonding the ball onto a wiring pattern and parallel transferring the capillary thereby to allow the edge provided at the capillary tip to scrape and cut the deformed ball.

The surface area of a bump can be sized by suitably adjusting the amount of metal wire to be melted, the tip shape of the capillary, and the pressing force. A bump can have any height by suitably adjusting the height to which capillary is lifted, the parallel transfer timing, or the like. The upper end of a bump may alternatively be flattened by processes, such as etching, blasting, polishing, or the like. The tip end of a stud bump may be softened or smoothed by allowing the tip end to melt and recrystallize using sparks generated by applying a voltage to the formed stud bump.

The bumps having two different surface areas are formed by way of the methods described above. This can reduce the distance between the bumps thereby highly densely arranging the bumps. Furthermore, softening the upper ends of the stud bumps allows the upper ends to be readily deformed during flip chip mounting and facilitates bonding to the electrodes of the light emitting element. This can achieve high-strength bonding even at room temperature.

The intervals between the first bumps, and between the second bumps, can be suitably set based on the size of the light emitting element, the number of bumps, or the like. For example, considering the fluidity of the resin material used in the cover member forming step described later, the distance between the second bumps 16 arranged in one direction is preferably set smaller than the distance between the first large bumps 15B arranged in the same direction. Similarly, the distance between the first small bumps arranged in the same direction is preferably set smaller than the distance between the first large bumps. Specifically, the distance between the first large bumps 15B is, for example, 20 to 50 µm, the distance between the second bumps 16 is, for example, 0 to 20 µm, and the distance between the first small bumps 15S is, for example, 50 to 80 µm.

From the heat dissipation standpoint, moreover, the larger the bonding area between the bumps and the light emitting element, the more preferable it is. For example, the total surface area of the first bumps connected to the first electrode is preferably at least 25% of the surface area of the first electrode. The total surface area of the second bumps connected to the second electrode is preferably at least 50% of the surface area of the second electrode.

Element Mounting Step

Figure 4C:
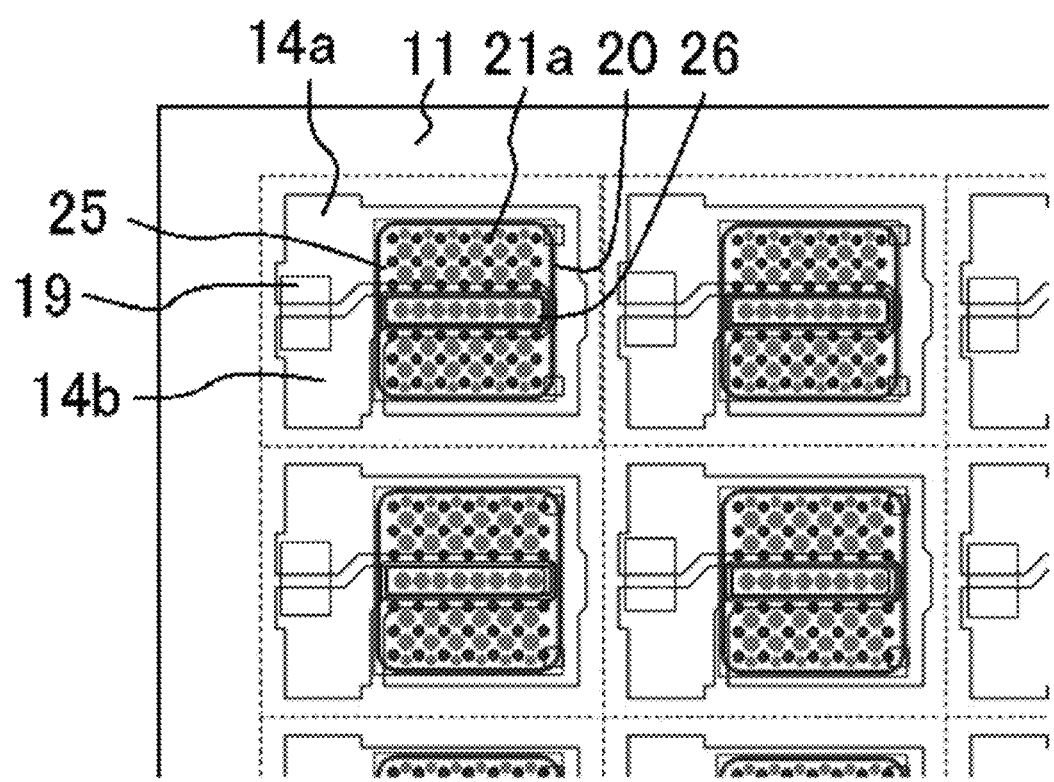
FIG. 4C is a schematic enlarged plan view for explaining an element mounting step in the method for manufacturing a light emitting device according to the present invention.

As shown in FIG. 4C, the light emitting element 20 is flip-chip mounted on the wiring pattern 14. The first electrode 25 and the second electrode 26 of the light emitting element 20 are bonded to the first bumps 15 and the second bumps 16, respectively. In this case, the first bumps 15 are arranged so that none of the first large bumps 15B and the first small bumps 15S overlap the exposed portions 21a of the first semiconductor layer of the light emitting element 20 in a plan view. Arranging the bumps spaced apart from the exposed portions in this manner can prevent cracks from forming in the light emitting element 20 attributable to the pressing force applied to the light emitting element when it is bonded onto the bumps. As shown in FIG. 2A and FIG. 2B, the first electrode 25 of the light emitting element 20 is formed on the second semiconductor layer via the insulation film 24. The insulation film 24 covers the semiconductor stack 23, and has the openings 24a above the exposed portions 21a. The first electrode 25 is formed to be electrically connected to the first semiconductor layer 21 at the bottom faces of the openings 24a, and to cover the lateral faces of the exposed portions 21a (i.e., lateral faces of the holes that form the exposed portions 21a) and the upper face of the second semiconductor layer via the insulation film 24 that covers the semiconductor stack. In the semiconductor stack 23, steps are formed by the surface of the second semiconductor layer and the exposed portions 21a. If a large load is applied to any of the steps, a crack might be formed in the light emitting element 20. The metal oxide or metal nitride used to form the insulation film 24, in particular, is hard, brittle, and thus susceptible to cracks, as compared to the metal material used to form the electrodes. A crack occurring in the insulation film would allow the first electrode to be in electrical conduction with the second semiconductor layer, which would likely cause the light emitting element 20 to have a short circuit. In other words, by arranging the bumps spaced apart from the exposed portions in a plan view, the occurrence of cracks in the insulation film 24 can effectively be avoided. Being arranged spaced apart herein means that the outer edges of the bumps do not overlap the outer edges of the exposed portions in a plan view even after the light emitting element is pressed to be connected to the bumps where the pressure laterally expands the bumps to increase their surface areas.

In the case where the first small bumps 15S among the first bumps are arranged in the vicinity of the two opposing sides of the light emitting element 20, the expansion of the bumps' surface areas caused by the pressure applied when the bumps are bonded to the light emitting element is smaller as compared to the first large bumps 15B. Thus, short circuits attributable to the laterally expanded bumps creeping onto the lateral faces of the light emitting element 20, or the like, can be avoided. Furthermore, even if the light emitting element 20 is warped, setting a smaller height for the first small bumps 15S than that for the first large bumps allows the light emitting element to attain an appropriate pressure load, bump expansion, and connection with the bumps corresponding to the warp.

Step of Disposing Light Transmissive Member

Figure 4D:
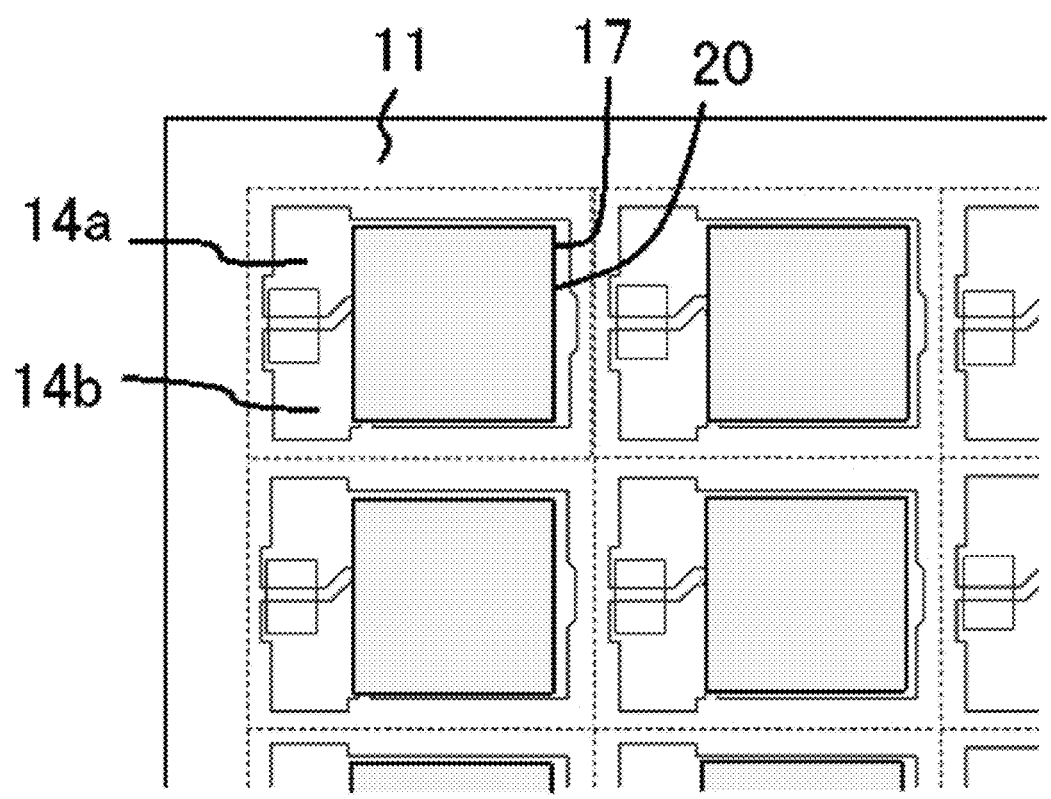
FIG. 4D is a schematic enlarged plan view for explaining a step of disposing a light transmissive member in the method for manufacturing a light emitting device according to the present invention.

The method for manufacturing a light emitting device according to the present embodiment may have a step of disposing a light transmissive member. In the step of disposing a light transmissive member, as shown in FIG. 4D, a light transmissive member 17 is disposed to cover the upper face of the light emitting element. The light transmissive member 17 can be disposed by using any transparent bonding material 18 known in the art.

The step of disposing a light transmissive material may be performed before the element mounting step; for example, in the case of bonding the light transmissive member and the light emitting element without using a bonding material 18, the step of disposing a light transmissive member is preferably performed before the element mounting step.

Cover Member Forming Step

The cover member forming step is a step of forming a cover member 13 on the substrate 11 that surrounds the light emitting element 20 which has been mounted. The cover member 13 is formed to cover the lateral faces of the bumps at the lower face of the light emitting element 20, i.e., between the light emitting element 20 and the substrate 11. In the case where the light emitting device is provided with a light transmissive member 17, the cover member 13 is formed to cover the lateral faces of the light transmissive member 17. At this point, exposing the upper face of the light transmissive member 17 from the cover member 13 produces a light emitting device 10 having the upper face of the light transmissive member 17 as the emission face.

The cover member 13 can be formed by placing a nozzle of a resin dispenser above the substrate 11 and moving the nozzle while dispensing an uncured resin from the nozzle tip.

The cover member 13 is preferably formed in multiple resin applications.

Figure 4E:
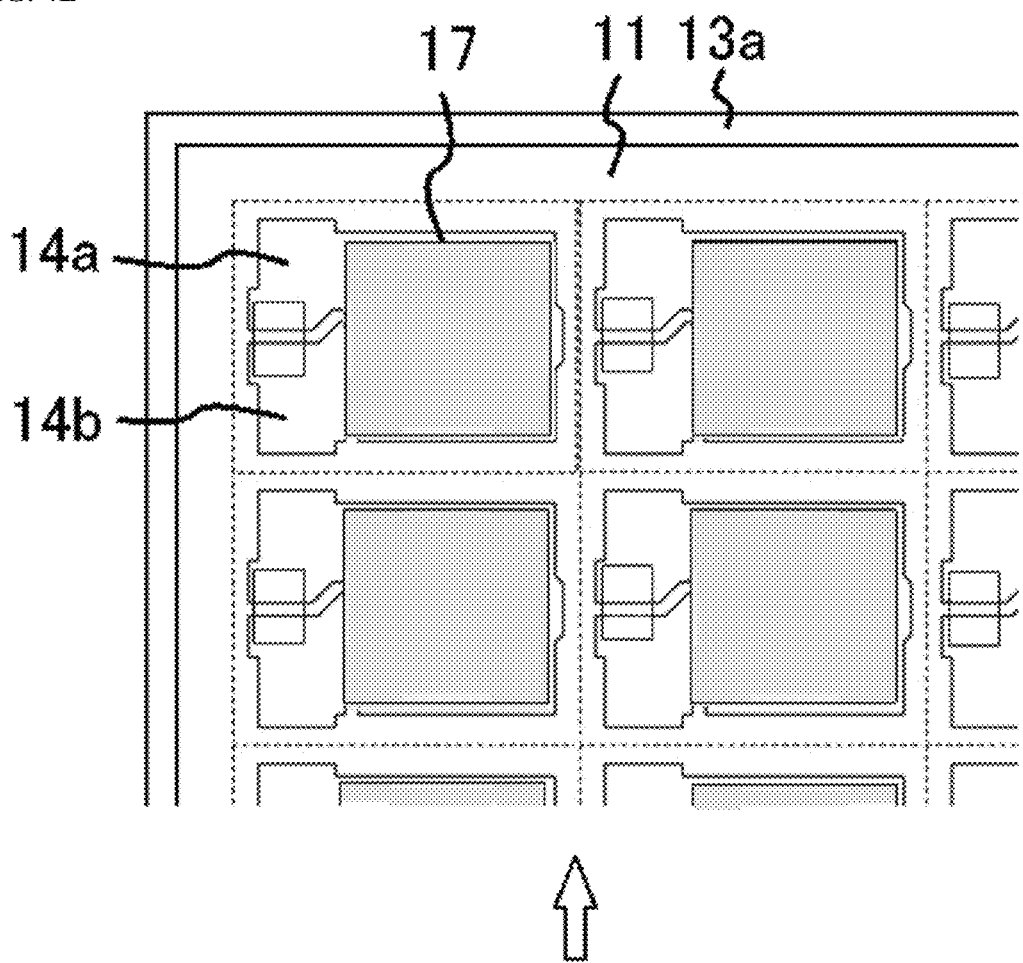
FIG. 4E is a schematic enlarged plan view for explaining a cover member forming step in the method for manufacturing a light emitting device according to the present invention.

First, as shown in FIG. 4E, the uncured resin material is dispensed between the multiple light emitting devices along the borders of the devices that are arranged in rows and columns on the collective body of the substrates every other row or column, for example, at the position indicated by the arrow in FIG. 4E. The resin material flows on the substrate 11 and under the light emitting element 20 while wetting and spreading over the substrate 11 as shown in FIG. 4F.

Figure 4F:
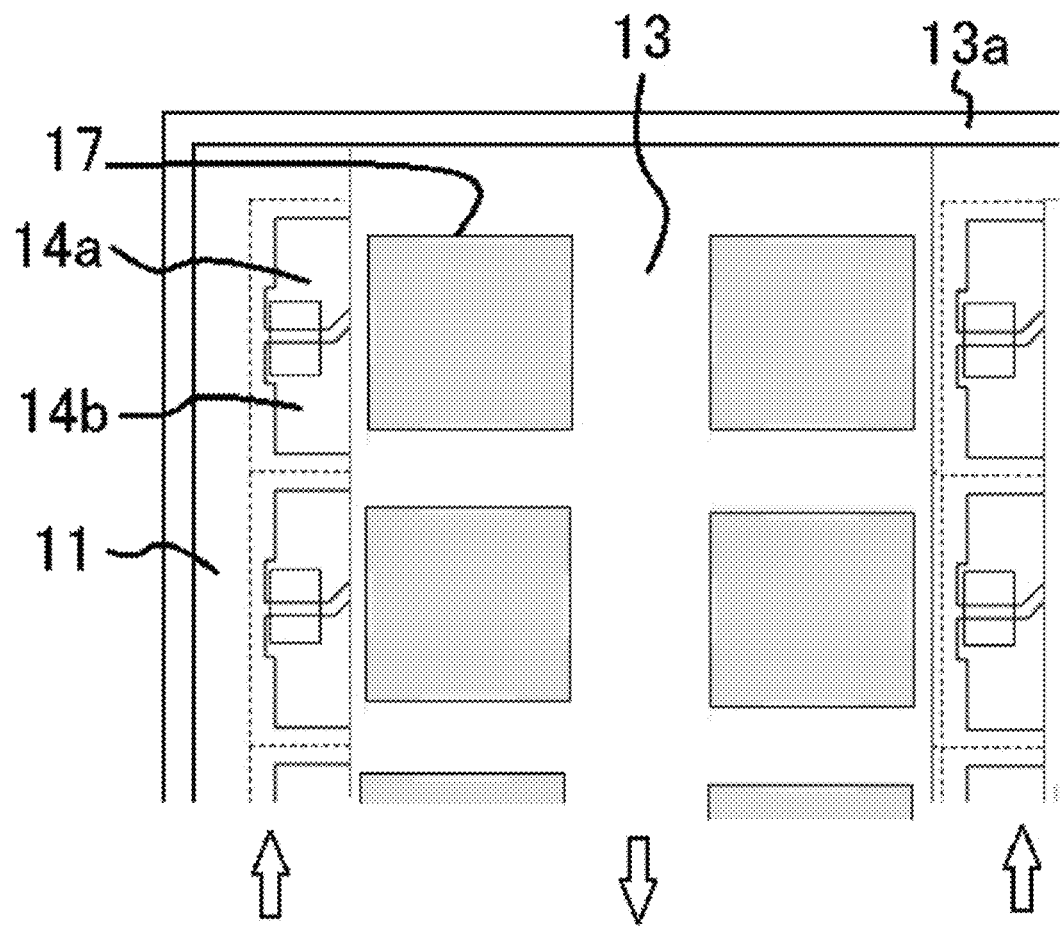
FIG. 4F is a schematic enlarged plan view for explaining a cover member forming step in the method for manufacturing a light emitting device according to the present invention.
Figure 4G:
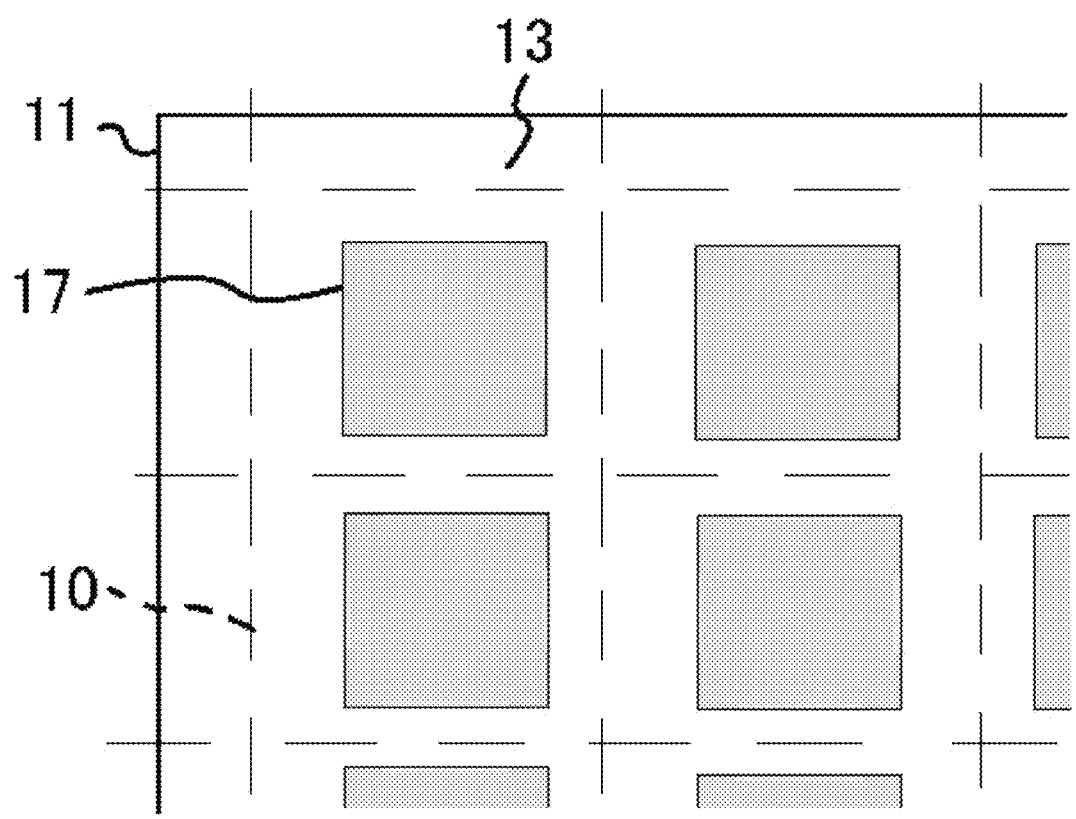
FIG. 4G is a schematic enlarged plan view for explaining a cover member forming step in the method for manufacturing a light emitting device according to the present invention.

Next, the resin material is dispensed similarly between the rows or columns of the devices, one row or column at a time, for example, as indicated by the arrows in FIG. 4F, to cover the lateral faces of the light emitting elements.

Supplying the resin material in two applications in this manner can reduce the occurrence of voids in the resin material disposed under the light emitting elements. In other words, supplying the resin material every other row or column during the first application allows the resin to flow from one side, thereby allowing the air to escape to the other side. After disposing the resin material under the light emitting elements, the resin material is supplied for the second time to form the resin that covers the lateral faces of the light emitting elements. In this manner, the resin material having fluidity can effectively penetrate into the space between the light emitting elements and the substrates.

Furthermore, the highly densely arranged bumps discussed earlier facilitate the flow of the resin material along the narrow spaces between the bumps (the so-called capillary action), allowing the cover member to be formed in the appropriate locations in a simplified manner while preventing the occurrence of voids.

In the present embodiment, moreover, the bumps are arranged so that the distance between the bumps located in the center of each light emitting element is shorter than the distance between the bumps located near the edges of the light emitting element along the direction of the flow of the resin material under the light emitting element, i.e., the direction perpendicular to the direction of the movement of the nozzle that supplies the resin material on the upper face of the substrate 11. This facilitates the flow of the resin material in the center of each light emitting element by utilizing the capillary action mentioned above, thereby reducing the occurrence of voids attributable to the resin material infiltrating from the edges. In the present embodiment, along the direction perpendicular to the direction of the nozzle movement, the first small bumps 15S are arranged at the outermost locations, i.e., near the edges of the substrate 11, while arranging the second bumps 16 each having about the same size as that of the first large bumps 15B at the innermost locations, i.e., in the vicinity of the center directly under the light emitting element, more densely than the first large bumps 15B.

Dividing Light Emitting Devices

As shown in FIG. 4G, the light emitting device 10 having a single light emitting element 20 mounted thereon can be obtained by dividing the substrate 11 having the cover member 13 formed thereon along the dotted lines in FIG. 4G into individual light emitting devices 10. The substrate can be divided by using any means known in the art, such as a dicing saw.

Example 1

The light emitting device according to Example 1 was produced by using the method for manufacturing a light emitting device described in the foregoing, using a light emitting element 20 having a plan view shape of substantially a square, 1.0 mm per side.

As shown in FIG. 2A and FIG. 2B, the light emitting element 20 has a second electrode 26 which has a narrow strip shape and is disposed vertically across the central portion of the element, and a first electrode 25 disposed on both sides of the second electrode 26. The first electrode 25 located on both sides of the second electrode 26 is continuous at both long side ends of the second electrode 26. In other words, the first electrode 25 is disposed to surround the narrow strip shaped second electrode 26. The width, i.e., the short side length, of the second electrode 26 is about 140 µm, and the width of the first electrode interposing the second electrode is about 370 µm on each side. Exposed portions 21a of the first semiconductor layer are arranged under the first electrode 25. The exposed portions 21a are each substantially circular in shape having a diameter of 53 µm, and 7×3 pieces of the exposed portions are arranged at equal intervals on each side of the second electrode 26. The distance between two opposing exposed portions that interpose the second electrode 26 is, for example, 0.28 µm. The distance from an edge of the semiconductor stack to the exposed portions that are closest to the edge is, for example, 0.07 µm.

In the substrate 11 having such a light emitting element 20 mounted thereon, the first bumps 15 are arranged at the positions spaced apart from and not overlapping the exposed portions 21a in the state where the light emitting element 20 is mounted on the wiring pattern 14; for example, at the positions indicated by the two-dot chain lines in the light emitting element 20 shown in FIG. 2A. Among the first bumps, the first large bumps 15B are each arranged per region of the smallest square having the exposed portions 21a at four corners. On the first electrode 25 in each of the regions on both sides of the second electrode, 6×2 pieces of the first large bumps 15B are disposed. The first large bumps 15B are substantially circular in shape and about 100 µm in diameter. The first small bumps 15S are arranged between the exposed portions 21a arranged along the edges of the semiconductor stack, 6×1 pieces per side. The first small bumps 15S are substantially circular in shape and about 80 µm in diameter.

The second bumps 16, 8×1 pieces, are arranged at equal intervals along the second electrode 26 in the state where the light emitting element 20 is mounted on the wiring pattern 14. The second bumps 16 are circular in shape and about 100 µm in diameter. The distance between two adjacent second bumps 16 is smaller than the distance between two adjacent first large bumps 15 arranged in the same direction.

In the light emitting device according to Example 1, the surface area of the first electrode 25 is about 0.694 mm$^2$, and the total surface area of the first bumps is about 0.235 mm$^2$. Thus, the total surface area of the first bumps is about 34% of the surface area of the first electrode. The surface area of the second electrode 26 is about 0.120 mm$^2$, and the total surface area of the second bumps is about 0.063 mm$^2$. Thus, the total surface area of the second bumps is about 53% of the surface area of the second electrode.

Example 2

The light emitting device according to Example 2 was produced by using the method for manufacturing a light emitting device described in the foregoing, using a light emitting element 30 having a plan view shape of substantially a square, 0.8 mm per side.

Figure 3:
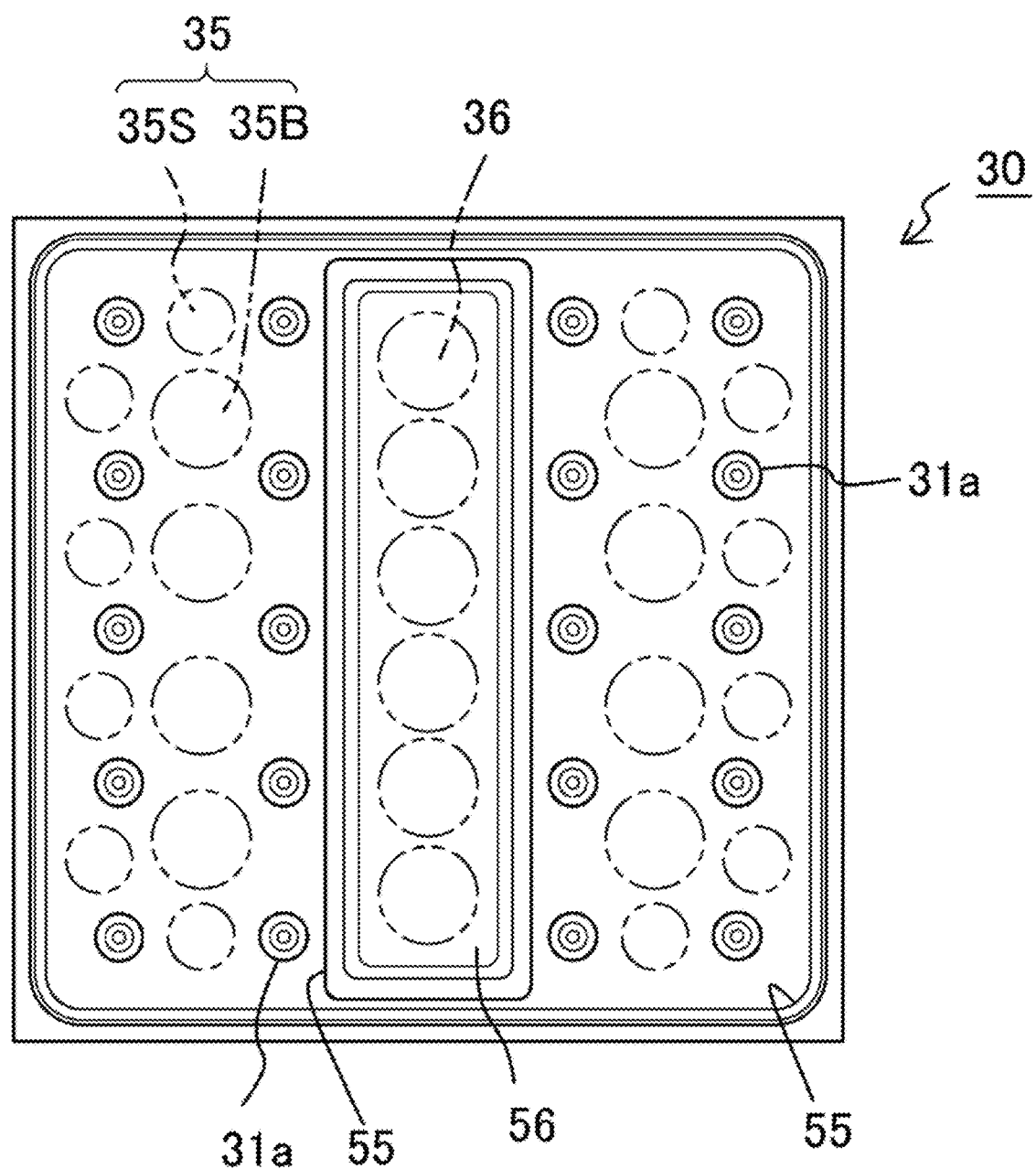
FIG. 3 is a schematic plan view of another light emitting element used in the light emitting device according to the present invention.

As shown in FIG. 3, the light emitting element 30, similar to the light emitting element 20 of Example 1, has a second electrode 56 which has a narrow strip shape and is disposed to divide the element in the middle, and a first electrode 55 which is disposed to surround the second electrode 56.

Exposed portions 31a of the first semiconductor layer are disposed under the first electrode 55. The exposed portions 31a which are substantially circular in shape, 53 µm in diameter, are regularly arranged at equal intervals, for example, with a distance between the centers of two adjacent exposed portions of 0.16 mm, on both sides of the second electrode 56, 5×2 pieces each. The distance between the centers of two opposing exposed portions that interpose the second electrode 56 is, for example, 0.28 mm. The distance from an edge of the semiconductor stack to the centers of the exposed portions that are closest to the edge is, for example, 0.007 mm.

In the substrate 11 having such a light emitting element 30 mounted thereon, the first bumps 35 and the second bumps 36 are arranged at the positions spaced apart from and not overlapping the exposed portions 21a in the state where the light emitting element 30 is mounted on the wiring pattern; for example, at the positions indicated by the two-dot chain lines in the light emitting element 30 shown in FIG. 3. Among the first bumps, the first large bumps 15B are each arranged per region of the smallest square having the exposed portions 21a at four corners. On the first electrode 55 in each of the regions on both sides of the second electrode 56, 4×1 pieces of the first large bumps 35B are disposed. The first large bumps 35B are substantially circular in shape and about 100 µm in diameter. The first small bumps 35S are arranged between the exposed portions 21a arranged along the edges of the semiconductor stack, 4×1 pieces per side. Moreover, a piece of first small bump 35S is arranged at each end of each column of the first large bumps 35B. The first small bumps 35S are substantially circular in shape and about 80 µm in diameter.

The second bumps 36, 6×1 pieces, are arranged at equal intervals along the second electrode 56 in the state where the light emitting element 30 is mounted on the wiring pattern.

The second bumps 36 are circular in shape and about 100 µm in diameter. The distance between two adjacent second bumps 36 is smaller than the distance between two adjacent first large bumps 35 which are arranged in the same direction.

In the light emitting device according to Example 2, the surface area of the first electrode 55 is about 0.396 mm$^2$, and the total surface area of the first bumps is about 0.117 mm$^2$. Thus, the total surface area of the first bumps is about 30% of the surface area of the first electrode. The surface area of the second electrode 56 is about 0.089 mm$^2$, and the total surface area of the second bumps is about 0.048 mm$^2$. Thus, the total surface area of the second bumps is about 54% of the surface area of the second electrode.

Figure 5:
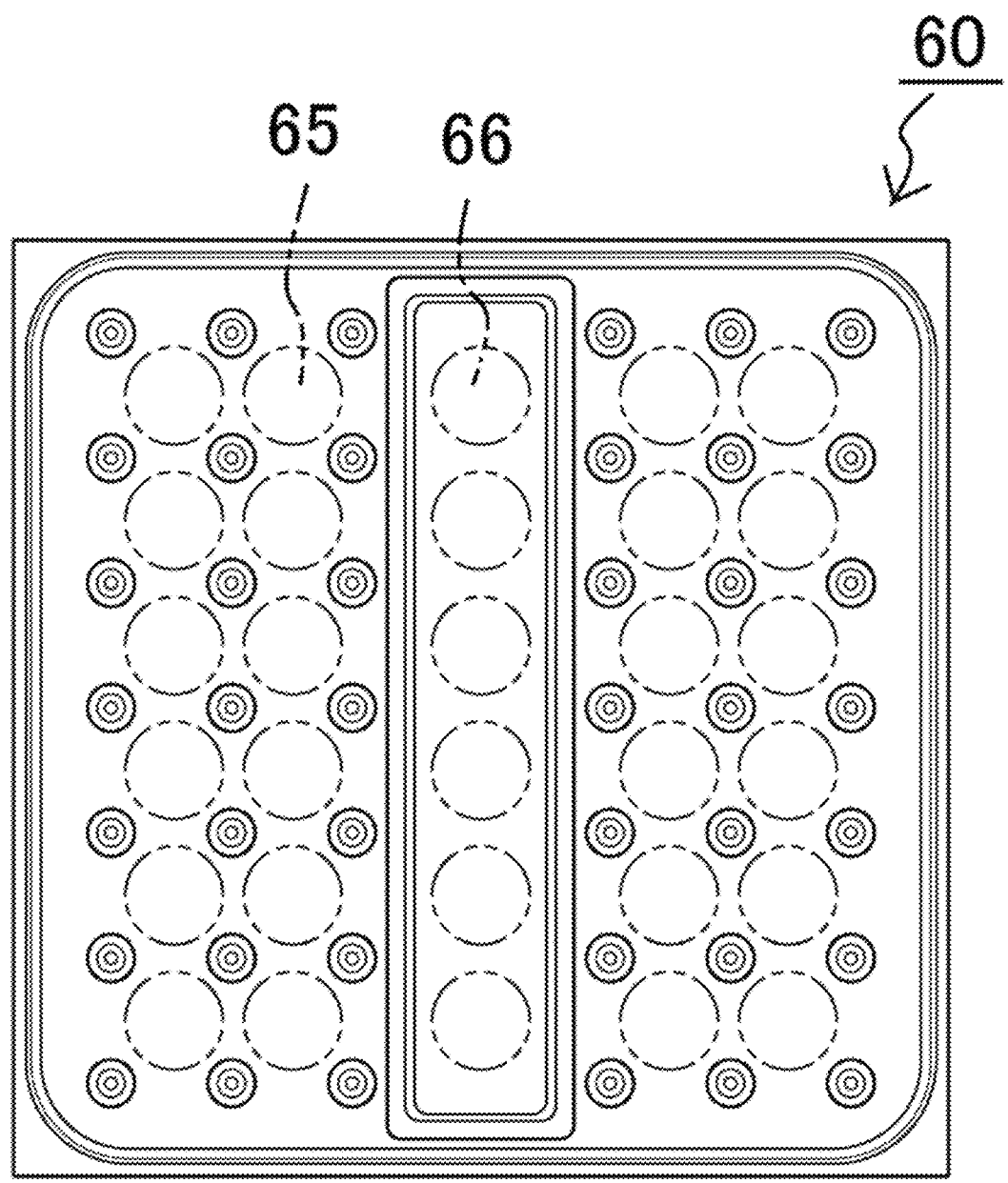
FIG. 5 is a schematic plan view of a comparative light emitting element.

As a comparative example, as shown in FIG. 5, a light emitting device was prepared using a light emitting element 60 having 6×1 pieces of second bumps 66 as opposed to the light emitting element 20. The light emitting device of the comparative example has a similar construction to that of Example 1 except for having no first small bumps and a fewer number of second bumps 66.

Evaluation

The thermal resistance and the bump strength of the light emitting devices of Example 1 and the comparative example were measured.

The results show that the thermal resistance (° C./W) decreased by 6.5% and the bonding strength (gf) between the light emitting element and the substrate increased by 4.5% as compared to the comparative example.

The light emitting device according to the present invention can be used as a light source in various applications, such as for lighting fixtures, various indicators, automotive lights, displays, liquid crystal display backlights, sensors, traffic lights, automotive parts, signage channel letters, and the like.

What is claimed is:

1. A method for manufacturing a light emitting device comprising:
   providing a substrate defining a mounting region having a wiring pattern on an upper face thereof;
   forming a plurality of bumps for bonding a light emitting element to the wiring pattern in the mounting region of the substrate so that the bumps are arranged in a plurality of columns extending parallel to each other with a distance between adjacent ones of the bumps in one of the columns arranged closest to an outer edge of the mounting region is larger than a distance between adjacent ones of the bumps arranged on an inner side of the mounting region in a plan view, and so that the bumps include a plurality of first bumps and a plurality of second bumps with the first bumps including a plurality of first large bumps and a plurality of first small bumps each having a smaller surface area than each of the first large bumps in a plan view, with all the bumps in the one of the columns arranged closest to the outer edge of the mounting region are the same size;
   mounting the light emitting element onto the bumps in the mounting region of the substrate in a flip-chip manner so that the first bumps are bonded to a first electrode of the light emitting element and the second bumps are bonded to a second electrode of the light emitting element; and
   forming a cover member that covers lateral faces of the light emitting element and the bumps.

2. The method for manufacturing a light emitting element according to claim 1, wherein the forming of the bumps includes forming the first bumps and the second bumps as stud bumps on the wiring pattern.

3. The method for manufacturing a light emitting element according to claim 1, wherein the forming of the bumps includes forming the first large bumps and the first small bumps of the first bumps so that a height of the first large bumps from the wiring pattern is different from a height of the first small bumps from the wiring pattern.

4. The method for manufacturing a light emitting element according to claim 1, further comprising disposing a light transmissive member on the light emitting element.

5. The method for manufacturing a light emitting element according to claim 4, wherein the disposing of the light transmissive member includes providing the light transmissive member containing a phosphor.

6. The method for manufacturing a light emitting element according to claim 4, wherein the disposing of the light transmissive member includes providing the light transmissive member so that a lower face of the light transmissive member has an area of about 80 to 150% of an upper face area of the light emitting element.

7. The method for manufacturing a light emitting element according to claim 1, wherein the forming of the bumps includes forming the bumps so that the bumps in the one of the columns closest to the outer edge of the mounting region are arranged at equal intervals.

8. The method for manufacturing a light emitting element according to claim 1, wherein the forming of the bumps includes forming the bumps so that the first bumps and the second bumps are arranged in different ones of the columns.

9. The method for manufacturing a light emitting element according to claim 8, wherein the forming of the bumps includes forming the bumps so that the first small bumps and the first large bumps are arranged in different ones of the columns.

10. The method for manufacturing a light emitting element according to claim 9, wherein the forming of the bumps includes forming the bumps so that a number of the first small bumps arranged in one of the columns is the same as a number of the first large bumps arranged in another of the columns.

11. The method for manufacturing a light emitting element according to claim 9, wherein the forming of the bumps includes forming the bumps so that the first small bumps are arranged in the one of the columns arranged closest to the outer edge of the mounting region.

12. The method for manufacturing a light emitting element according to claim 1, wherein the forming of the bumps includes forming the bumps so that a number of the second bumps arranged in one of the columns is higher than a number of the bumps arranged in other ones of the columns.

13. The method for manufacturing a light emitting element according to claim 1, wherein the first electrode of the light emitting element is arranged on both sides of the second electrode in the plan view.

14. The method for manufacturing a light emitting element according to claim 1, wherein the forming of the cover member includes providing the cover member containing a light reflective material.

15. The method for manufacturing a light emitting element according to claim 1, wherein the forming of the bumps includes forming the bumps so that a total surface area of the first bumps connected to the first electrode is at least 25% of a surface area of the first electrode.

16. The method for manufacturing a light emitting element according to claim 1, wherein the forming of the bumps includes forming the bumps so that a total surface area of the second bumps connected to the second electrode is at least 50% of a surface area of the second electrode.

\* \* \* \* \*